(12) United States Patent
Hatakeyama et al.

(10) Patent No.: US 6,699,337 B2
(45) Date of Patent: Mar. 2, 2004

(54) COPPER-BASE ALLOYS HAVING IMPROVED PUNCHING PROPERTIES ON PRESS AND A PROCESS FOR PRODUCING THEM

(75) Inventors: Koichi Hatakeyama, Iwata-gun (JP); Akira Sugawara, Iwata-gun (JP)

(73) Assignee: Dowa Mining Co., Ltd., Tokyo (JP)

( * ) Notice: Subject to any disclaimer, the term of this patent is extended or adjusted under 35 U.S.C. 154(b) by 233 days.

(21) Appl. No.: 10/007,432

(22) Filed: Dec. 3, 2001

(65) Prior Publication Data

US 2002/0108685 A1 Aug. 15, 2002

(30) Foreign Application Priority Data

Dec. 18, 2000 (JP) ........................................ 2000-383087

(51) Int. Cl.[7] .............................. C22F 1/08; C22C 9/00
(52) U.S. Cl. ...................... 148/433; 148/432; 148/434; 148/435; 148/436; 148/684
(58) Field of Search ................. 148/433, 432, 148/434, 435, 436, 684, 685

(56) References Cited

U.S. PATENT DOCUMENTS

| | | | |
|---|---|---|---|
| 5,147,469 A | * | 9/1992 | Kanzaki et al. ............. 148/684 |
| 5,205,878 A | * | 4/1993 | Kanzaki et al. ............. 148/684 |
| 5,322,575 A | * | 6/1994 | Endo et al. ................... 148/554 |
| 5,643,679 A | * | 7/1997 | Ishimaru et al. ............. 428/472 |
| 6,254,702 B1 | * | 7/2001 | Hana et al. ................... 148/433 |
| 6,334,915 B1 | * | 1/2002 | Ogura et al. ................ 148/435 |

FOREIGN PATENT DOCUMENTS

| | | | |
|---|---|---|---|
| EP | 0949343 A1 | * | 10/1999 |
| JP | 05-051712 | * | 3/1993 |
| JP | 2000-073130 | * | 3/2000 |
| JP | 2000-080428 | * | 3/2000 |
| JP | 2000-328158 | * | 11/2000 |
| JP | 2001-152303 | * | 6/2001 |

* cited by examiner

*Primary Examiner*—John J. Zimmerman
(74) *Attorney, Agent, or Firm*—Frishauf, Holtz, Goodman & Chick, P.C.

(57) ABSTRACT

An ingot of a copper-base alloy containing a total of 0.01–30 wt % of at least one element selected from among Sn, Ni, P, Zn, Si, Fe, Co, Mg, Ti, Cr, Zr and Al, with the balance being Cu and incidental impurities, is homogenized by annealing, subjected to repeated cycles of cold rolling and annealing, then cold rolled at a reduction ratio Z which satisfies the following relation:

$$Z \geq 100 - 10X - Y \quad (1)$$

[where Z is the percent reduction by cold rolling; X is the content in wt % of Sn; Y is the total content in wt % of any elements other than Sn], and thereafter subjected to cold annealing at a temperature below the recrystallization temperature to produce a copper-base alloy having a surface X-ray diffraction intensity ratio $S_{ND}$ of at least 10 [$S_{ND}$= I$\{220\}$/I$\{200\}$; I$\{220\}$ is the X-ray diffraction intensity of $\{220\}$ and I$\{200\}$ is the X-ray diffraction intensity of $\{200\}$] while exhibiting improved punching properties on press due to the balance between electrical conductivity, strength, spring property, hardness and bending properties.

17 Claims, 1 Drawing Sheet

COPPER-BASE ALLOYS HAVING IMPROVED PUNCHING PROPERTIES ON PRESS AND A PROCESS FOR PRODUCING THEM

BACKGROUND OF THE INVENTION

This invention relates to copper-base alloys having improved punching properties on press and a process for producing them. More particularly, the invention relates to copper-base alloys having improved punching properties on press that are suitable for use in master plates for consumer products such as information/communication small-pitch connectors, semiconductor leadframes, as well as small switches and relays, and a process for producing such alloys.

As the mounting density of consumer electronics, information/communication equipment and automotive parts has increased, connectors, switches, relays, etc. have become increasingly smaller, requiring the use of thinner sheets and finer wires of copper-base alloy materials in these devices.

The parts mentioned above are often worked by punching on high-speed press in combination with a metal mold. During press working, the material undergoes shear deformation with the metal mold punch and then crack propagation starting from the blade tip causes breaking deformation which causes the material to be punched out in a specified shape. As the press is run for an increasing number of shots, the blade tip of the punch wears progressively; as a result, uneven crack propagation occurs from the blade tip and irregularities develop in the breaking profile, as exemplified by an increased difference between shear zone and breaking zone, massive burrs, and heavy tailings of the material that result from the breaking operation; these phenomena all contribute to failure to maintain the desired product shape.

Conventional efforts to increase the mold life include the use of a punch of better material quality, the use of a press lubricant for higher lubricity and clearance settings suitable for various copper-base alloys. However, none of these approaches have offered a complete solution to the problem.

The present inventors conducted intensive studies with a view to solving the aforementioned problems of the prior art. In the fabrication of small-pitch connectors and semiconductor leadframes by punching on high-speed press in combination with a mold, the recent trend is for thinner and narrower pin terminals, specifically in a thickness range of 0.10–0.25 mm and a width range of 0.10–0.30 mm. This design consideration has raised the need for pin terminals to meet the characteristics requirement that they maintain the balance between strength and bending property while exhibiting improved punching properties on press.

SUMMARY OF THE INVENTION

An object, therefore, of the present invention is to provide copper-base alloys that are controlled in material's crystal orientations to exhibit improved punching properties on press.

Another object of the invention is to provide a process for producing such alloys.

For the purposes of the invention, the strength of a pin terminal can be replaced by the 0.2% yield value of the material of which the pin terminal is made. The bending properties of the pin terminal can be replaced by the value of elongation achieved in a tensile test since it undergoes uniaxial deformation when $W/t \leq 4$ (t is the sheet thickness of the pin terminal in millimeters and W is its width in millimeters).

The present invention has been accomplished on the basis of the finding that copper-base alloys having better punching property on press could be obtained by controlling the diffraction intensities of a copper-base alloy material in particular crystal directions among those which were determined by applying X-ray diffraction to the ND plane (which is the surface of the sheet material and hereunder referred to simply as "ND plane"). Specifically, the copper-base alloy of the invention was produced by a process comprising the steps of cold rolling an ingot of a copper-base alloy containing specified amounts of elements such as Sn and Ni, annealing the cold-rolled ingot, and then cold rolling the annealed ingot at a reduction ratio not lower than a specified value as calculated from the contents of non-copper alloying elements. The term "X-ray diffraction intensity" as used herein means the integral intensity of crystal directions of the copper-base alloy material measured by an appropriate method such as X-ray diffraction.

The first object of the invention can be attained by a copper-base alloy having improved punching properties on press that contains a total of 0.01–30 wt % of at least one element selected from the group consisting of Sn, Ni, P, Zn, Si, Fe, Co, Mg, Ti, Cr, Zr and Al, with the balance being Cu and incidental impurities, and which has a surface X-ray diffraction intensity ratio $S_{ND}$ of at least 10 [$S_{ND}$=I{220}/I{200}; I{220} is the X-ray diffraction intensity of {220} and I{200} is the X-ray diffraction intensity of {200}].

The first object of the invention can also be attained by a copper-base alloy having improved punching properties on press that contains a total of 0.01–30 wt % of at least one element selected from the group consisting of Sn, Ni, P, Zn, Si, Fe, Co, Mg, Ti, Cr, Zr and Al, with the balance being Cu and incidental impurities, and which has a surface X-ray diffraction intensity ratio $S_{ND}$ of at least 10 [$S_{ND}$=(I{220}+I{311})/I{200}; I{220} is the X-ray diffraction intensity of {220}, I{311} is the x-ray diffraction intensity of {311}, and I{200} is the X-ray diffraction intensity of {200}].

The first object of the invention can also be attained by a copper-base alloy having improved punching property on press that contains a total of 0.01–30 wt % of at least one element selected from the group consisting of Sn, Ni, P, Zn, Si, Fe, Co, Mg, Ti, Cr, Zr and Al, with the balance being Cu and incidental impurities, and which has a surface X-ray diffraction intensity ratio $S_{DD}$ of at least 10 [$S_{ND}$=(I{220}+I{111})/I{200}; I{220} is the X-ray diffraction intensity of {220}, I{111} is the X-ray diffraction intensity of {111}, and I{200} is the X-ray diffraction intensity of {200}].

The first object of the invention can also be attained by a copper-base alloy having improved punching property on press that contains a total of 0.01–30 wt % of at least one element selected from the group consisting of Sn, Ni, P, Zn, Si, Fe, Co, Mg, Ti, Cr, Zr and Al, with the balance being Cu and incidental impurities, and which has a surface X-ray diffraction intensity ratio $S_{ND}$ of at least 10 [$S_{ND}$=(I{220}+I{111}+I{311})/I{200}; I{220} is the X-ray diffraction intensity of {220}, I{111} is the X-ray diffraction intensity of {111}, I{311} is the X-ray diffraction intensity of {311}, and I{200} is the X-ray diffraction intensity of {200}].

In a preferred embodiment, each of the copper-base alloys defined above may contain 0.3–3.0 wt % of Sn.

The second object of the invention can be attained by a process for producing any one of the copper-base alloys described above, which comprises the steps of performing at least one cycle of cold rolling and subsequent annealing on an ingot of a copper-base alloy containing a total of 0.01–30 wt % of at least one element selected from the group consisting of Sn, Ni, P, Zn, Si, Fe, Co, Mg, Ti, Cr, Zr and Al, with the balance being Cu and incidental impurities, and thereafter cold rolling the annealed alloy at a reduction ratio not lower than a specified value as determined from the content of said at least one element.

The second object of the invention can also be attained by a process for producing any one of the copper-base alloys described above, which comprises the steps of performing at least one cycle of cold rolling and subsequent annealing on an ingot of a copper-base alloy containing a total of 0.01–30 wt % of at least one element selected from the group consisting of Sn, Ni, P, Zn, Si, Fe, Co, Mg, Ti, Cr, Zr and Al, with the balance being Cu and incidental impurities, and thereafter cold rolling the annealed alloy at a reduction ratio Z which satisfies the following relation:

$$Z \geq 100-10X-Y \quad (1)$$

[where Z is the percent reduction by cold rolling; X is the content in wt % of Sn; Y is the total content in wt % of any elements other than Sn].

The second object of the invention can also be attained by a process for producing any one of the copper-base alloys described above, which comprises the steps of performing at least one cycle of cold rolling and subsequent annealing on an ingot of a copper-base alloy containing a total of 0.01–30 wt % of at least one element selected from the group consisting of Sn, Ni, P, Zn, Si, Fe, Co, Mg, Ti, Cr, Zr and Al, with the balance being Cu and incidental impurities, thereafter cold rolling the annealed alloy at a reduction ratio Z which satisfies the following relation:

$$Z \geq 100-10X-Y \quad (1)$$

[where Z is the percent reduction by cold rolling; X is the content in wt % of Sn; Y is the total content in wt % of any elements other than Sn], and subsequently cold annealing the rolled alloy at a temperature below the recrystallization temperature.

In a preferred embodiment, said cycle or cycles of cold rolling and subsequent annealing are preceded by performing either homogenizing annealing or hot rolling or both on the ingot.

DETAILED DESCRIPTION OF THE INVENTION

Figure 1:
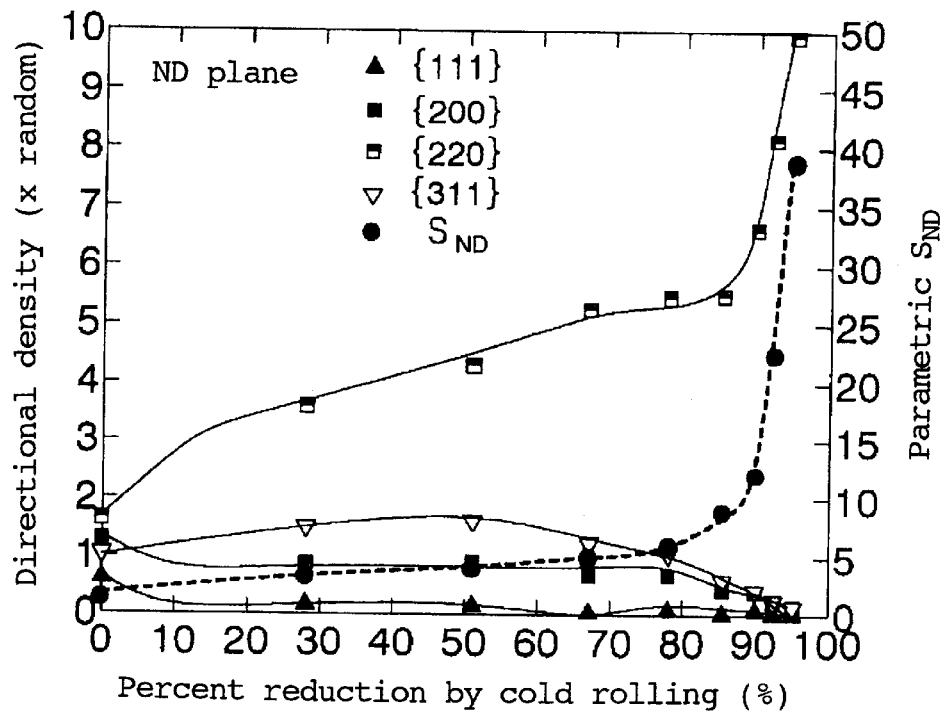
FIG. 1 is a graph showing the relationship between the percent reduction by cold rolling, directional density and $S_{ND}$.

We now describe the present invention in detail. The invention is based on the finding that a copper-base alloy having improved punching properties on press could be obtained by controlling the diffraction intensities of a copper-base alloy material in particular crystal directions among those which were determined by applying X-ray diffraction to the surface of the alloy material.

First, in order to perform satisfactory press working in which shear deformation of the material is followed by uniform crack propagation from the blade tip of a punch to achieve effective breaking deformation, it is important that the crystal directions of the material be aligned to have a certain orientation. A Cu-base polycrystalline material having a face-centered cubic (FCC) crystal structure has a total of 12 slip systems {111} and <110> depending upon the combination of slip planes {111} and slip directions <110> (the brackets give a collective notation for equivalent planes and the pointed brackets a collective notation for equivalent directions), and at least one of these slip systems is active in deformation. In shear deformation on press, the slip system forming the smallest angle with the punching direction is active.

Consider here four principal planes of a sheet material, the {110} plane, the {111} plane, the {311} plane and the {100} plane, provided that the material's surface is designated by the ND plane. If this material is subjected to shear deformation on press, the {110} plane having two slip systems that agree with the punching direction is the most effective in improving its punching properties on press. The next effective is the {111} and {311} planes having slip systems that form comparatively small angles with the punching direction. In contrast, the {100} plane in which 8 out of the 12 slip systems form an angle of 45 degrees with the punching direction has the most adverse effects on the punching properties on press. Specifically, great stress is exerted on the blade tip of the punch, the blade tip wears at an accelerated rate, more metal shavings result from breaking deformation and get stuck in the mold (between punch and die) to accelerate the wear of the blade tip, eventually producing burrs of greater height on the material after it breaks.

When metals such as copper-base alloys having an FCC crystal structure are subjected to X-ray diffraction, the diffraction intensities of the {110}, {111}, {311} and {100} planes occur as I{220}, I{111}, I{311} and I{200}, respectively.

Considering these facts, the present inventors made intensive studies in order to solve the aforementioned problems of the prior art. They measured the diffraction intensities I{220}, I{111}, I{311} and I{200} for the {220}, {111}, {311} and {200} planes of a copper-base alloy, introduced a new parameter $S_{ND}$ (=I{220}/I{200}) and successfully improved the punching properties on press of the alloy by controlling its structure using $S_{ND}$ as an index. Stated specifically, terminals of good shape could be punched out when $S_{ND}$ was at least 10. On the other hand, when $S_{ND}$ was less than 10, the blade tip was progressively worn away as the press was run for an increased number of shots and only terminals of poor shape could be punched out.

Depending on the type of copper-base alloys, I{311} may be greater than a tenth of I{220}, or I{111} may be greater than a tenth of I{220}, or the sum of I{111} and I{311} may be greater than a tenth of I{220}. In these cases, $S_{ND}$= I{220}/I{200} are preferably replaced by $S_{ND}$=(I{220}+ I{311})/I{200}, $S_{ND}$=(I{220}+I{111})/I{200}, and $S_{ND}$= (I{220}+I{111}+I{311})/I{200}, respectively.

The chemistry of the copper-base alloy of the invention is specified such that it contains a total of 0.01–30 wt % of at least one element selected from the group consisting of Sn, Ni, P, Zn, Si, Fe, Co, Mg, Ti, Cr, Zr and Al, with the balance being Cu and incidental impurities. This requirement must be satisfied in order to maintain the balance between the electrical conductivity, tensile strength, 0.2% yield, elongation and bending property of the alloy material while improving its punching properties on press.

If the total content of at least one element selected from the group consisting of Sn, Ni, P, Zn, Si, Fe, Co, Mg, Ti, Cr, Zr and Al is less than 0.01 wt %, higher electrical conductivity is achieved but other characteristics such as tensile strength, 0.2% yield and punching properties on press are difficult to obtain. If the degree of reduction by rolling is increased to 98%, tensile strength and 0.2% yield can be improved but there is no significant improvement in the punching properties on press and the bending properties deteriorate. If the total content of at least one element selected from the group consisting of Sn, Ni, P, Zn, Si, Fe, Co, Mg, Ti, Cr, Zr and Al exceeds 30 wt %, the tensile strength and 0.2% yield can be improved but there occurs deterioration in electrical conductivity and bending properties.

For these reasons, the chemistry of the copper-base alloy of the invention is specified such that it contains a total of 0.01–30 wt % of at least one element selected from the group consisting of Sn, Ni, P, Zn, Si, Fe, Co, Mg, Ti, Cr, Zr and Al, with the balance being Cu and incidental impurities. In addition to the elements listed above, at least one element selected from the group consisting of Ag, Au, Bi, In, Mn, La, Pb, Pd, Sb, Se, Te and Y may be incorporated in a total amount of no more than 2 wt % without interfering with the primary additive elements but contributing to a further improvement in the punching properties on press.

We now describe the criticality of the primary elements at least one of which must be added in a total amount within the range specified above.

(1) Sn

Tin (Sn) is an essential element to ensure not only good punching properties on press but also strength and elasticity. If dissolved in the Cu matrix, Sn can markedly reduce the integration of the {200} plane which is adverse to the punching properties on press and, upon combination with the thermo-mechanical treatment, Sn can also markedly increase the integration of the {220}, {111} and {311} planes, eventually contributing to an improvement in the punching properties on press. At-the same time, improvements in strength and elasticity can be achieved. However, if the Sn content is less than 0.01 wt %, the desired effect is not attained. If the Sn content exceeds 10 wt %, there occurs marked drop in electrical conductivity and forgeability as well as hot workability are adversely affected. Economic disadvantage also results since Sn is an expensive element. Therefore, the Sn content should be kept between 0.01 and 10 wt %, preferably between 0.3 and 3.0 wt %.

(2) Ni

Nitrogen (Ni) dissolves in the Cu matrix to improve its strength, elasticity and solderability. It also combines with P, sometimes Si, to form a compound that causes dispersion precipitation to improve electrical conductivity, as well as strength and elasticity. Nitrogen also contributes to improvements in heat resistance and stress relief characteristics. If the Ni content is less than 0.01 wt %, these effects of Ni are not fully attained. If the Ni content exceeds 4.0 wt %, there occurs significant drop in electrical conductivity even in the presence of P (occasionally Si) and economic disadvantage also results. Therefore, the Ni content should be kept between 0.01 and 4.0 wt %, preferably between 0.40 and 3.0 wt %.

(3) P

Phosphorus (P) works as a deoxidizer for the molten metal during melting and casting; it also combines with Ni, sometimes Fe, Mg or Co, to form a compound that causes dispersion precipitation to improve electrical conductivity, as well as strength and elasticity. If the P content is less than 0.01 wt %, these effects of P are not fully attained. If the P content exceeds 0.20 wt %, there occurs significant drop in electrical conductivity and weather resistance of solder even in the presence of Ni (occasionally Fe, Mg or Co). Hot workability is also adversely affected. Therefore, the P content should be kept between 0.01 and 0.20 wt %, preferably between 0.02 and 0.10 wt %.

(4) Zn

Zinc (Zn) dissolves in the Cu matrix to improve its strength and elasticity; it also enhances the deoxidation of the melt to reduce the amount of dissolved oxygen in the Cu matrix; in addition, Zn helps improve the weather resistance of solder and the ability to resist migration. However, these effects of Zn are not attained if its content is less than 0.01 wt %. If the Zn content exceeds 30 wt %, not only electrical conductivity but also solderability deteriorates. Even if the excessive Zn is combined with other elements, the alloy has an undesirably higher sensitivity to stress corrosion cracking. Therefore, the Zn content should be kept between 0.01 and 30 wt %, preferably between 0.01 and 10 wt %, more preferably between 0.03 and 3.0 wt %.

(5) Si

Silicon (Si), if it is present with Ni, precipitates in the Cu matrix to form a compound that contributes to improving strength and elasticity without causing significant drop in electrical conductivity. These effects of Si are not attained if its content is less than 0.01 wt %. If the Si content exceeds 1.0 wt %, there occurs significant drop in hot workability. Therefore, the Si content should be kept between 0.01 and 1.0 wt %.

(6) Fe, Co, Mg, Ti, Cr, Zr and Al

These elements dissolve or precipitate in the Cu matrix to form compounds that contribute to improvements in strength, elasticity and heat resistance, as well as in punching properties on press. These effects are not attained if one of those elements is added in an amount less than 0.01 wt %. If one of those elements is contained in an amount greater than 3.0 wt %, there occurs significant drop in electrical conductivity and economic disadvantage will result, as exemplified by the need to perform heat treatments at unduly high temperatures during alloy fabrication. Therefore, the total content of at least one of Fe, Co, Mg, Ti, Cr, Zr and Al should be kept between 0.01 and 3.0 wt %.

(7) Oxygen

A word must be said about oxygen. If its content is excessive, Fe, Mg, P and other elements will form oxides which may potentially deteriorate reliability in plating and other characteristics of the copper-base alloy of the present invention. Therefore, the oxygen content is preferably held at no more than 20 ppm.

We now describe the criticality of the heat treatments and other processing steps for producing the copper-base alloy of the invention. The copper-base alloy material of the invention can be produced by the following procedure: an ingot of a copper-base alloy having the chemistry set forth above is rendered to have a specified sheet thickness by repeating the cycle of cold rolling and annealing; the sheet is then subjected to cold rolling at a reduction ratio that is not lower than a specified value determined from the contents of the additive elements and which is specifically defined as the percent reduction by cold rolling Z that satisfies the relation (1); if necessary, the cold rolled sheet is subjected to cold annealing at a temperature less than the recrystallization point to give a desired thickness.

If the ingot is subjected to homogenizing annealing or hot rolling before it is cold rolled, the segregation of microscopic or macroscopic dissolved elements that occurred during casting is effectively removed to provide a uniform distribution of such dissolved elements. In particular, preliminary hot rolling helps randomize the crystal orientations of the ingot and produce fine uniform crystal grains; economic advantage also results since greater reduction in thickness can be achieved by rolling operations. Therefore, it is recommended that either homogenizing annealing or hot rolling or both of these be performed before cold rolling the ingot. Homogenizing annealing and hot rolling are preferably performed at 700–900° C. for 0.5–2 hours.

The percent reduction by cold rolling Z should satisfy the following relation:

$$Z(\%) \geq 100 - 10X - Y \qquad (1)$$

where X is the content in wt % of Sn; Y is the total content in wt % of any elements other than Sn.

When the alloy sheet was cold rolled at a reduction ratio satisfying the relation (1), the integration of the {200} plane which would deteriorate the punching properties on press was markedly reduced on the ND plane while at the same time, the integration of the {220}, {111} and {311} planes, particularly of the {220} plane which would improve its punching properties on press was increased so markedly as to provide improved punching properties on press. In this instance, parameter $S_{ND}$ was no smaller than 10 ($S_{ND} \geq 10$). Furthermore, tensile strength and 0.2% yield were improved, achieving an improvement in elongation that would otherwise decrease with the increasing degree of reduction by rolling. When the cold rolling at reduction ratio Z was followed by cold annealing at a temperature lower than the recrystallization point, the relative integrations of the {200}, {220}, {111} and {311} planes hardly changed and tensile strength and 0.2% yield were still maintained so that the annealed sheet had as good punching properties on press as the as-rolled sheet. What is more, cold annealing contributed to improving elongation, or bending property.

Therefore, in the most desirable mode, cold rolling at reduction ratio Z (%) that satisfies the relation (1) is combined with cold annealing at a temperature lower than the recrystallization point. Preferably, cold annealing is performed at a temperature 50–250° C. lower than the recrystallization temperature of the copper-base alloy for 0.5–2 hours, typically at 250–350° C. for 0.5–1 hour. The desired characteristics can of course be obtained with other temperature and time combinations if they impart a comparable quantity of heat to the alloy material.

When cold rolling was done at reduction ratios that did not satisfy the relation (1), the integration of the {200} plane hardly decreased whereas the integration of the {220} plane did not increase as much as to improve punching properties on press. In this instance, $S_{ND}$ was smaller than 10. At reduction ratios that did not satisfy the relation (1), tensile strength and 0.2% yield improved with the increasing reduction ratio but, on the other hand, elongation and hence bending property deteriorated. When the cold rolling at reduction ratios that did not satisfy the relation (1) was followed by cold annealing at a temperature lower than the recrystallization point, the relative integrations of the {200}, {220}, {111} and {311} planes hardly changed and there was no possibility for an improvement in punching properties on press. An attempt to improve the bending property resulted in deteriorated tensile strength and 0.2% yield, thus making it impossible to maintain the balance between the three parameters.

Figure 2:
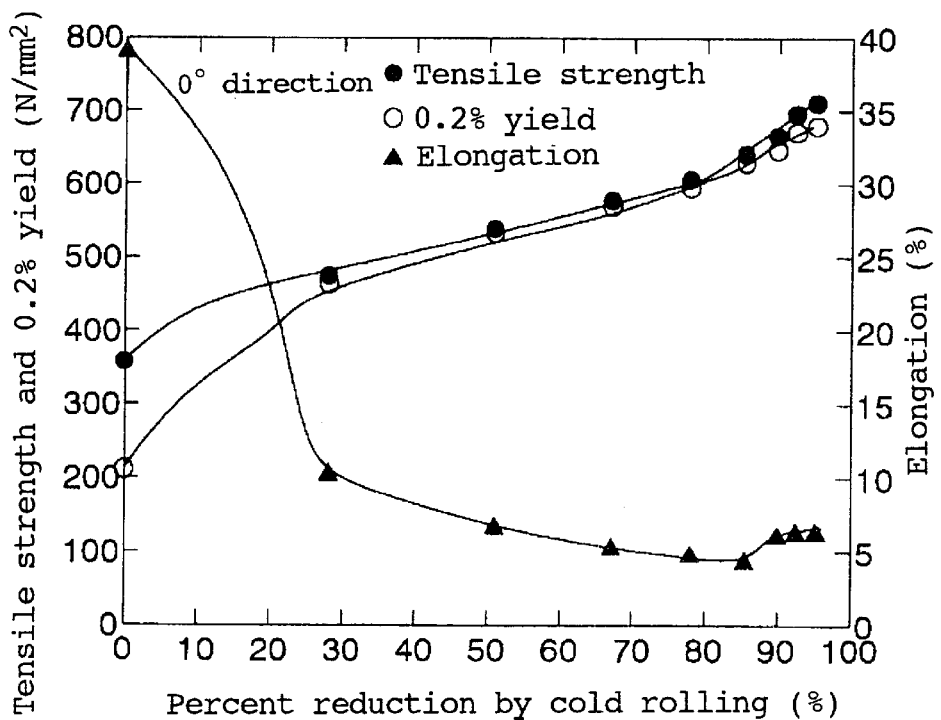
FIG. 2 is a graph showing the relationship between the percent reduction by cold rolling, tensile strength, 0.2% yield and elongation.

A typical illustration of these phenomena is given in FIGS. 1 and 2; FIG. 1 shows the relationship between the percent reduction of Cu-1.0 wt % Ni-0.90 wt % Sn-0.05 wt % P alloy by rolling and the integration of various crystal directions, and FIG. 2 shows the relationship between the percent reduction of the same copper-base alloy by rolling and its three characteristics, tensile strength, 0.2% yield and elongation. Given the chemistry of the alloy, the percent reduction Z by cold rolling will satisfy the relation (1) if it is 89.95% or more. As one can see from FIG. 1, when Z was at least 89.95%, the integration of the {200} plane deleterious to punching properties on press decreased markedly whereas the integration of the {220} plane beneficial to punching properties on press increased significantly. Speaking of $S_{ND}$, it was 12 at Z=90% and 22 at Z=92.5%. It is interesting to note that tensile strength, 0.2% yield, and even elongation could be improved in the experiment (see FIG. 2).

The following examples are provided for the purpose of further illustrating the present invention but are in no way to be taken as limiting.

EXAMPLE 1

Copper-base alloy sample Nos. 1–4, 6–9 and 11–16 having the chemical analyses (wt %) shown in Table 1 were melted in an argon atmosphere and cast into ingots measuring 20 mm×80 mm×1000 mm in a vertical continuous machine. The ingots were homogenized by heat treatment at 900° C. for 1 hour. Thereafter, the ingots (Nos. 1–4, 6–9 and 11–16) were hot rolled to reduce their thickness from 20 mm to 6.0 mm, quenched with water and pickled. The 6.0-mm thick sheets were cold rolled to various thicknesses; 2.5 mm for Nos. 1, 7 and 8; 2.0 mm for Nos. 2, 3 and 16; 1.0 mm for Nos. 4, 6 and 15; 3.5 mm for No. 9; 0.6 mm for No. 11; 0.5 mm for No. 12; 0.3 mm for No. 13; and 0.23 mm for No. 14.

Copper-base alloy sample Nos. 5, 10, 17 and 18 having the chemical analyses (wt %) shown in Table 1 were melted in an argon atmosphere and cast into ingots measuring 10 mm×80 mm×1000 mm in a horizontal continuous machine. The ingots were homogenized by heat treatment at 800° C. for 1 hour, then subjected to repeated cycles of cold rolling, annealing and cold rolling so that they were reduced in thickness to the following values: 0.6 mm for No. 5; 0.3 mm for No. 10; 0.25 mm for No. 17; and 0.24 mm for No. 18.

The thus prepared sheet sample Nos. 1–18 were subjected to heat treatment at 550° C. for 1 hour. The crystal grains in the treated sheets had sizes between 5 and 20 μm; the surface of each sheet (ND plane) was subjected to X-ray diffraction and measurement of $S_{ND}$, which was found to be at least 0.5 but less than 2.0.

The intensities of X-ray diffraction were measured under the following conditions: tube bulb, Cu; tube voltage, 40 kV; tube current, 30 mA; sampling width, 0.020°; monochrometer, used; sample holder, Al.

These are not the only conditions for X-ray diffraction analysis and various modifications can be made depending on the type of sample.

The sample Nos. 1–18 were then cold rolled to a final thickness of 0.20 mm. In the last step, they were subjected to a 30-min heat treatment at 300° C. which was lower than the recrystallization temperature. The thus prepared samples were subjected to the evaluation of various characteristics.

In the first place, $S_{ND}$ was measured and evaluated, then electrical conductivity, 0.2% yield, 180° bending property and punching properties on press were evaluated. Electrical conductivity and 0.2% yield were measured and evaluated in accordance with JIS H 0505 and JIS Z 2241, respectively. For evaluation of bending property, a 180° bend test (JIS H 3110) was conducted in the following manner: test specimens in the form of a pin having a width of 0.50 mm were punched out of each sample in a direction parallel to the rolling direction and bent until cracking occurred; the bending property was evaluated in terms of a minimum value of R/t at which no cracking occurred in the bent, where R is the radius of inward bending and t is sheet thickness. To evaluate punching properties on press, terminals having a pin width of 0.50 mm were punched out by continuous pressing and after $5 \times 10^4$ shots, the burrs on the pins were examined by SEM for their maximum height.

EXAMPLE 2

Sample alloy No. 1 (see Table 1 above; sheet thickness 0.20 mm) according to the invention, a commercial phosphor bronze alloy (C5191; condition, H; sheet thickness, 0.20 mm; 6.5 wt % Sn, 0.2 wt % P, bal. Cu) and a commercial copper-base alloy (C7025; condition, H; sheet thickness, 0.20 mm; 3.2 wt % Ni, 0.70 wt % Si, 0.15 wt % Mg, bal. Cu) were evaluated for electrical conductivity, 0.2% yield, ultimate spring flex, Vickers hardness, press workability and bending property.

TABLE 1

| Sample | | Composition (wt %) | | | | Ideal Percent Reduction By Rolling Z (%) = 100 − 10X − Y | Actual Percent Reduction By cold Rolling (%) | SND (≧10) | Burr height (μm) | Electrical Conductivity (% IACS) | 0.2% Yield (N/mm²) | 180° bending property R/t* (in 0° direction) |
|---|---|---|---|---|---|---|---|---|---|---|---|---|
| | No. | X Sn | Y Ni | P | Others | Cu | | | | | | |
| Invention Samples | No. 1 | 0.91 | 1.02 | 0.05 | — | Rem | 89.8 | 92.5 | 22 | 3 | 40.2 | 590 | 0 |
| | No. 2 | 1.50 | 0.47 | 0.02 | Zn:1.48 | Rem | 83.0 | 90.0 | 25 | 4 | 33.8 | 605 | 0.5 |
| | No. 3 | 2.00 | 1.21 | 0.07 | Zn:0.20,Fe:0.05 | Rem | 78.4 | 90.0 | 35 | 2 | 30.9 | 645 | 0.5 |
| | No. 4 | 2.00 | — | 0.03 | Fe:0.10 | Rem | 79.8 | 80.0 | 20 | 3 | 35.4 | 620 | 0 |
| | No. 5 | 4.00 | — | 0.03 | Fe:0.10 | Rem | 59.8 | 67.0 | 25 | 3 | 22.4 | 660 | 0 |
| | No. 6 | 1.75 | — | — | Zn:10.6,Fe:1.70,Co:0.20 | Rem | 70.0 | 80.0 | 18 | 4 | 33.8 | 605 | 0.5 |
| | No. 7 | 0.52 | 2.00 | — | Si:0.50,Zn:1.00 | Rem | 91.3 | 92.5 | 20 | 6 | 47.3 | 630 | 0.5 |
| | No. 8 | 0.50 | 3.20 | — | Si:0.70,Zn:1.00 | Rem | 90.1 | 92.5 | 15 | 5 | 43.9 | 640 | 0.5 |
| | No. 9 | 0.30 | 2.30 | — | Si:0.55,Zn:0.50,Mg:0.10 | Rem | 93.5 | 94.3 | 12 | 8 | 42.3 | 630 | 0.5 |
| | No. 10 | 8.00 | 0.40 | 0.20 | Fe:0.10,Zn:0.10 | Rem | 19.2 | 33.0 | 13 | 5 | 12.5 | 660 | 0.5 |
| Comparative Samples | No. 11 | 0.91 | 1.02 | 0.05 | — | Rem | 89.8 | 67.0 | 5.0 | 15 | 40.2 | 530 | 0 |
| | No. 12 | 1.50 | 0.47 | 0.02 | Zn:1.48 | Rem | 83.0 | 58.0 | 7.0 | 15 | 33.8 | 530 | 0 |
| | No. 13 | 2.00 | 1.21 | 0.07 | Ti:0.01,Cr:0.02,Zr:0.01 | Rem | 78.7 | 33.0 | 8.5 | 12 | 30.9 | 540 | 0 |
| | No. 14 | 0.52 | 2.00 | — | Si:0.50,Zn:1.00 | Rem | 91.3 | 13.0 | 2.9 | 18 | 42.3 | 580 | 0.5 |
| | No. 15 | 0.50 | 3.20 | — | Si:0.70,Zn:1.00 | Rem | 90.1 | 80.0 | 9.0 | 12 | 43.9 | 680 | 2.0 |
| | No. 16 | 0.30 | 2.30 | — | Si:0.55,Zn:0.50,Mg:0.10 | Rem | 93.5 | 90.0 | 7.5 | 12 | 40.2 | 670 | 2.0 |
| | No. 17 | 6.00 | — | 0.20 | — | Rem | 39.8 | 20.0 | 9.0 | 12 | 14.5 | 530 | 0 |
| | No. 18 | 8.00 | — | 0.20 | — | Rem | 19.8 | 16.0 | 8.0 | 12 | 12.8 | 570 | 0.5 |

*Minimum value of R/t at which no cracking occurred when a test specimen t mm thick and W mm wide (W/t = 2.5) was bent inwardly at a radius of R mm.

The following are clear from Table 1: satisfying $S_{ND} \geq 10$ and Z (%)≧100−10X−Y, copper-base alloy sample Nos. 1–10 according to the invention could be punched out on press without producing burrs higher than 10 μm; in addition to this improved punching property on press, those samples of the invention had a good balance between electrical conductivity, 0.2% yield and bending property; on the other hand, comparative sample Nos. 11–18 which were cold rolled at reduction ratios lower than the ideal values had $S_{ND}$ values less than 10 and could not be punched out on press without producing burrs higher than 10 μm. The height of the burrs occurring in sample Nos. 15–18 was 12 μm, not very much different from 10 μm; sample Nos. 15 and 16 had a good balance between electrical conductivity and 0.2% yield but their bending property was low; sample Nos. 17 and 18 had a good balance between 0.2% yield and bending property but their electrical conductivity was lower than 15% IACS.

The measurements of electrical conductivity, 0.2% yield, ultimate spring flex and Vickers hardness were in accordance with JIS H 0505, JIS Z 2241, JIS H 3130 and JIS Z 2244, respectively. To evaluate press workability, terminals having a pin width of 0.50 mm were continuously punched out by a similar pressing method to Example 1 until burrs higher than 25 μm formed and the number of shots that could be run up to that time was counted as a maximum number of shots. The punch was made of ultra-high strength steel and the die was made of die steel; the punch-to-die clearance was 8 μm; the press had a rotating speed of 250 rpm. For evaluation of bending property, a 180° bend test (JIS H 3110) was conducted in the following manner: test specimens in the form of a pin having a width of 0.50 mm were punched out of each sample and bent until cracking occurred; the bending property was evaluated in terms of a minimum value of R/t at which no cracking occurred in the bent, where R is the radius of inward bending and t is sheet thickness. The results are shown in Table 2.

TABLE 2

| | Electrical conductivity (% IACS) | 0.2% Yield (N/mm²) 0° direction 90° direction | Ultimate spring flex (N/mm²) 0° directions 90° direction | Vickers hardness (HV) | Maximum Number of press shots (× 10⁴) | Minimum R/t* 0° direction 90° direction |
|---|---|---|---|---|---|---|
| Invention alloy No. 1 | 40 | 590, 615 | 470, 600 | 195 | 320 | 0, 0 |
| C5191 H | 13 | 600, 610 | 390, 540 | 200 | 300 | 0, 0 |
| C7025 H | 50 | 640, 600 | 560, 540 | 220 | 150 | 1.0, 0.5 |

*Minimum value of R/t at which no cracking occurred in the surface of a bend.

As Table 2 shows, the copper-base alloy of the invention had a better balance between electrical conductivity, 0.2% yield, ultimate spring flex, Vickers hardness, press workability and bending property than C5191 and C7025 which are typical prior art copper-base alloys for use in connectors, switches and relays. For use in small-pitch connectors, 0.2% yield, ultimate spring flex and bending property should be at high levels in the 90° direction and the alloy of the invention successfully met this requirement.

As described on the foregoing pages, the present invention provides copper-base alloys for use in connectors, switches, relays and the like that have so much improved punching properties on press as to reduce the wear of the blade tip of the punch and which also exhibit a good balance between electrical conductivity, 0.2% yield, spring properties, hardness and bending properties. The alloys can be worked into thinner sheets or finer wires that meet the requirement of modern consumer electronics, information/communication equipment and automotive parts for higher mounting density and they also help extend the life of the pressing mold to achieve substantial reduction in the fabrication cost.

What is claimed is:

1. A copper-base alloy having improved punching properties on press that contains a total of 0.01–30 wt % of at least one element selected from the group consisting of Sn, Ni, P, Zn, Si, Fe, Co, Mg, Ti, Cr, Zr and Al, with the balance being Cu and incidental impurities, and which has a surface X-ray diffraction intensity ratio $S_D$ of at least 10 [$S_{ND}$=I{220}/I{200}; I{220} is the X-ray diffraction intensity of {220} and I{200} is the X-ray diffraction intensity of {200}].

2. A copper-base alloy having improved punching properties on press that contains a total of 0.01–30 wt % of at least one element selected from the group consisting of Sn, Ni, P, Zn, Si, Fe, Co, Mg, Ti, Cr, Zr and Al, with the balance being Cu and incidental impurities, and which has a surface X-ray diffraction intensity ratio $S_{ND}$ of at least 10 [$S_{ND}$=(I{220}+I{311})/I{200}; I{220} is the X-ray diffraction intensity of {220}, I{311} is the X-ray diffraction intensity of {311}, and I{200} is the X-ray diffraction intensity of {200}].

3. A copper-base alloy having improved punching property on press that contains a total of 0.01–30 wt % of at least one element selected from the group consisting of Sn, Ni, P, Zn, Si, Fe, Co, Mg, Ti, Cr, Zr and Al, with the balance being Cu and incidental impurities, and which has a surface X-ray diffraction intensity ratio $S_{ND}$ of at least 10 [$S_{ND}$=(I{220}+I{111})/I{200}; I{220} is the X-ray diffraction intensity of {220}, I{111} is the X-ray diffraction intensity of {111}, and I{200} is the X-ray diffraction intensity of {200}].

4. A copper-base alloy having improved punching property on press that contains a total of 0.01–30 wt % of at least one element selected from the group consisting of Sn, Ni, P, Zn, Si, Fe, Co, Mg, Ti, Cr, Zr and Al, with the balance being Cu and incidental impurities, and which has a surface X-ray diffraction intensity ratio $S_{ND}$ of at least 10 [$S_{ND}$=(I{220}+I{111}+I{311})/I{200}; I{220} is the X-ray diffraction intensity of {220}, I{111} is the X-ray diffraction intensity of {111}, I{311} is the X-ray diffraction intensity of {311}, and I{200} is the X-ray diffraction intensity of {200}].

5. The copper-base alloy according to one of claims 1–4, which contains 0.3–3.0 wt % of Sn.

6. A process for producing the copper-base alloy according to one of claims 1–4, which comprises the steps of performing at least one cycle of cold rolling and subsequent annealing on an ingot of a copper-base alloy containing a total of 0.01–30 wt % of at least one element selected from the group consisting of Sn, Ni, P, Zn, Si, Fe, Co, Mg, Ti, Cr, Zr and Al, with the balance being Cu and incidental impurities, and thereafter cold rolling the annealed alloy at a reduction ratio not lower than a specified value as determined from the content of said at least one element.

7. The process according to claim 6, wherein said copper-base alloy contains 0.3–3.0 wt % of Sn.

8. A process for producing the copper-base alloy according to one of claims 1–4, which comprises the steps of performing at least one cycle of cold rolling and subsequent annealing on an ingot of a copper-base alloy containing a total of 0.01–30 wt % of at least one element selected from the group consisting of Sn, Ni, P, Zn, Si, Fe, Co, Mg, Ti, Cr, Zr and Al, with the balance being Cu and incidental impurities, and thereafter cold rolling the annealed alloy at a reduction ratio Z which satisfies the following relation:

$$Z \geq 100 - 10X - Y \quad (1)$$

[where Z is the percent reduction by cold rolling; X is the content in wt % of Sn; Y is the total content in wt % of any elements other than Sn].

9. The process according to claim 8, wherein said copper-base alloy contains 0.3–3.0 wt % of Sn.

10. A process for producing the copper-base alloy according to any one of claims 1–4, which comprises the steps of performing at least one cycle of cold rolling and subsequent annealing on an ingot of a copper-base alloy containing a total of 0.01–30 wt % of at least one element selected from the group consisting of Sn, Ni, P, Zn, Si, Fe, Co, Mg, Ti, Cr, Zr and Al, with the balance being Cu and incidental impurities, thereafter cold rolling the annealed alloy at a reduction ratio Z which satisfies the following relation:

$$Z \geq 100 - 10X - Y \quad (1)$$

[where Z is the percent reduction by cold rolling; X is the content in wt % of Sn; Y is the total content in wt % of any elements other than Sn], and subsequently cold annealing the rolled alloy at a temperature below the recrystallization temperature.

11. The process according to claim 10, wherein said copper-base alloy contains 0.3–3.0 wt % of Sn.

12. The process according to claim 6, wherein said cycle or cycles of cold rolling and subsequent annealing are preceded by performing either homogenizing annealing or hot rolling or both on the ingot.

13. The process according to claim 7, wherein said cycle or cycles of cold rolling and subsequent annealing are preceded by performing either homogenizing annealing or hot rolling or both on the ingot.

14. The process according to claim 8, wherein said cycle or cycles of cold rolling and subsequent annealing are preceded by performing either homogenizing annealing or hot rolling or both on the ingot.

15. The process according to claim 9, wherein said cycle or cycles of cold rolling and subsequent annealing are preceded by performing either homogenizing annealing or hot rolling or both on the ingot.

16. The process according to claim 10, wherein said cycle or cycles of cold rolling and subsequent annealing are preceded by performing either homogenizing annealing or hot rolling or both on the ingot.

17. The process according to claim 11, wherein said cycle or cycles of cold rolling and subsequent annealing are preceded by performing either homogenizing annealing or hot rolling or both on the ingot.

* * * * *